US012113541B2

(12) United States Patent
Hamaguchi et al.

(10) Patent No.: US 12,113,541 B2
(45) Date of Patent: Oct. 8, 2024

(54) ANALOG-TO-DIGITAL CONVERTER

(71) Applicant: Sharp Semiconductor Innovation Corporation, Tenri (JP)

(72) Inventors: Kohji Hamaguchi, Tenri (JP); Takahiro Inoue, Tenri (JP); Takayuki Shimizu, Tenri (JP); Isamu Kawabe, Tenri (JP); Tetsuro Ikeda, Tenri (JP)

(73) Assignee: Sharp Semiconductor Innovation Corporation, Tenri (JP)

( * ) Notice: Subject to any disclaimer, the term of this patent is extended or adjusted under 35 U.S.C. 154(b) by 205 days.

(21) Appl. No.: 17/988,749

(22) Filed: Nov. 16, 2022

(65) Prior Publication Data

US 2023/0163771 A1    May 25, 2023

(30) Foreign Application Priority Data

Nov. 19, 2021 (JP) ................. 2021-188893

(51) Int. Cl.
*H03M 1/06* (2006.01)
*H03M 1/52* (2006.01)

(52) U.S. Cl.
CPC ....... *H03M 1/0604* (2013.01); *H03M 1/0641* (2013.01); *H03M 1/52* (2013.01)

(58) Field of Classification Search
CPC .... H03M 1/0604; H03M 1/0641; H03M 1/52; H03M 1/129; Y02E 60/10; G02F 1/1333; G02F 1/1335
See application file for complete search history.

(56) References Cited

U.S. PATENT DOCUMENTS

| 5,148,171 A * | 9/1992 | Blumberg ............... H03M 1/50 341/166 |
| 9,236,876 B2 * | 1/2016 | Miyake ................... H03M 1/56 |
| 2012/0113074 A1 | 5/2012 | Inoue et al. |

FOREIGN PATENT DOCUMENTS

| JP | H0575862 A | 3/1993 |
| JP | 2012104656 A | 5/2012 |

\* cited by examiner

*Primary Examiner* — Khai M Nguyen
(74) *Attorney, Agent, or Firm* — ScienBiziP, P.C.

(57) ABSTRACT

An analog-to-digital convertor of an integration type, includes: a charging circuit having a capacitor configured to store electric charges based on an input current; a discharging circuit configured to discharge the electric charges stored in the capacitor; and a counting circuit configured to count a charge-discharge count of the capacitor in a first conversion period and in a second conversion period, in order to convert a current value of the input current into a digital value, wherein the first conversion period includes a first pre-charging period and a first counting period, the second conversion period includes a second pre-charging period and a second counting period, and the analog-to-digital convertor further comprises a phase changing circuit configured to change a first phase of an output signal of the charging circuit in the first counting period to a second phase in the second counting period.

9 Claims, 11 Drawing Sheets

ANALOG-TO-DIGITAL CONVERTER

CROSS-REFERENCE TO RELATED APPLICATION

The present application claims priority from Japanese Application JP 2021-188893, the content to which is hereby incorporated by reference into this application.

BACKGROUND OF THE INVENTION

1. Field of the Invention

The present invention relates to an integration analog-to-digital conversion circuit.

2. Description of the Related Art

A liquid crystal panel for such devices as a cellular phone and a digital camera is provided with an illumination sensor to control the amount of light, to be emitted from the backlight of the liquid crystal panel, in accordance with illumination of ambient light. A proximity sensor is used for a liquid crystal panel of such a device as a cellular phone. For lower power consumption, the proximity sensor turns OFF the liquid crystal panels when the face of the user comes closer to the cellular phone. As to these mobile devices, filters are provided to the sensors so that the sensors are not seen from outside. Hence, light incident on the sensors is weak. That is why illumination sensors are required to be able to measure low illumination, and proximity sensors are required to be able to detect objects with small input signals. Conventionally, there is a demand for such an analog-to-digital convertor as one described in Japanese Unexamined Patent Application Publication No. 2012-104656. The analog-to-digital convertor is small in circuit size and capable of measuring current with high precision.

FIG. 10 is a circuit diagram illustrating a conventional analog-to-digital convertor 91.

The analog-to-digital convertor 91 substantially includes: a charging circuit 92; a comparing circuit 95; a counting circuit 94; and a discharging circuit 93. The charging circuit 92 includes: a capacitor C1; and a differential amplifier AMP1. The comparing circuit 95 includes: a comparator CMP1; a switch SW1; and a voltage supply 85. The voltage supply 85 outputs a reference voltage Vref. The counting circuit 94 includes: a D flip flop 81; and a counter 82. The discharging circuit 93 includes: a current source 83; and a switch SW2.

FIG. 11 is a waveform diagram illustrating operation timing of the analog-to-digital convertor 91. When the operation starts, a low level signal is input to the switch SW1 and the switch SW1 is closed. Hence, an output signal Vsig of the charging circuit 92; namely, an integrating circuit, is equal to the reference voltage Vref. During a conversion period tconv, a high level signal is input to the switch SW1 and the switch SW1 turns OFF. Hence, an input current Iin charges the capacitor C1 with electric charges, and analog-to-digital conversion is executed. Described below is detailed operation of the analog-to-digital converter 91.

First, in synchronization with the rise of a clock signal clk, a pre-charging signal to the switch SW2 in the discharging circuit 93 goes HIGH (pre-charging), and the switch SW2 turns ON. Hence, pre-charging operation is executed to discharge certain electric charges in the capacitor C1 and to reduce the output signal Vsig.

Then, in synchronization with the next rise of the clock signal clk, the pre-charging signal goes LOW and the stitch SW2 turns OFF. After that, the charging circuit 92 (an integrator), namely, an integrating circuit, is charged with the input current Iin. When the output signal Vsig of the charging circuit 92 increases and exceeds the reference voltage Vref, a comparison signal comp to be output from the comparing circuit 95 goes to a HIGH voltage. The comparison signal comp is sampled by the D flip flop 81. An electric charge signal charge to be output from the D flip flop 81 to the switch SW2 and to a counter 12 goes to a HIGH voltage.

While the electric charge signal charge output to the switch SW2 is HIGH, the switch SW2 is ON. The electric charges stored in the capacitor C1 of the charging circuit 92 are discharged. Hence, the output signal Vsig of the charging circuit 25 decreases.

When the electric charge signal charge output to the switch SW2 goes LOW, the switch SW2 turns OFF. The charging circuit 92 is charged with the input current Iin, and the output signal Vsig rises. When the output signal Vsig exceeds the reference voltage Vref, the comparison signal comp and the electric charge signal charge go HIGH and the switch SW2 turns ON. Hence, the output signal Vsig decreases.

The analog-to-digital convertor 91 repeats the above operation. During the conversion period tconv in which the switch SW1 is OFF, the counter 82 counts a discharge count count of the discharging circuit 93. Hence, a digital value ADCOUT can be output, depending on the current Iin that has been input.

Note that the analog-to-digital convertor 91 operates so that the amount of the electric charges to be charged with the input current Iin is equal to the amount of the electric charges to be discharged with a current I flowing in the discharging circuit 93. Hence, the amount of charged electric charges=the amount of discharged electric charges is represented by Equation (2) below:

$$Iin \times tconv = I \times tclk \times count \qquad (2)$$

From Equation (2) above, Equation (3) below is obtained:

$$count = (Iin \times tconv)/(I \times tclk) \qquad (3)$$

Wherein tclk is a cycle of the clock signal clk, tconv is a conversion period in which the charging circuit 92 is charged with the input current Iin, I is a reference current value, and count is the discharge count of the discharging circuit 93.

A minimum resolution is determined by (I×tclk).

If the conversion period tconv is set to be represented by Equation (4) below $$tconv = tclk \times 2^n \text{ (where } n \text{ is a resolution)} \qquad (4),$$

Equation (5) below is obtained;

$$count = Iin/I \times 2^n \qquad (5)$$

For example, if the resolution n is 16 bits, the counter 82 outputs a value based on the input current Iin within a range of 0 to 65535. Hence, the integration analog-to-digital convertor 91 can perform analog-to-digital conversion in a wide dynamic range and with a high resolution.

Moreover, in order to reduce a quantization error that occurs when signal processing is executed using an n-bit quantized signal; that is, a continuous signal quantized by an analog-to-digital convertor, a known technique to reduce the quantization error uses an adding unit to randomly add a noise signal, having any given bit number m, within a predetermined region in a gray scale width of the quantized signal quantized by the analog-to-digital convertor (Japanese Unexamined Patent Application Publication No. H05-075862).

SUMMARY OF THE INVENTION

In recent years, smart phones have a larger screen showing images in full-screen. Moreover, organic light-emitting diode (OLED) displays are increasingly adopted. Because an OLED display is transparent to light (a typical transmittance of approximately 3 to 5%), an optical sensor is installed on the back surface of the display so that the display functions as a full-screen display.

An optical sensor to be installed on the back surface of a display has to detect a slight variation in illumination observed when external light passes through the back surface of the display. Hence, the optical sensor is required to have sensitivity higher than before. In order to improve the sensitivity of the optical sensor, conceivable solutions are to increase the area of a photo diode (PD) in the optical sensor and to improve the sensitivity of an AD convertor circuit in the optical sensor. However, the increase in the area of the PD leads to an increase in the chip size of the optical sensor, causing a problem of increasing costs. The improvement in the sensitivity of the AD convertor circuit leads to an increase in noise component. The increase in noise component reduces a signal component at a transmittance of the display, and, in addition, causes a problem of deterioration in SN ratio.

These problems can be overcome when measurement results of the optical sensor are sequentially added. For example, the results of measurements conducted twice are added together so that the sensitivity can be doubled.

However, when the measurement results of the optical sensor are simply added together, the problem is that an error that develops in the quantization (the quantization error) is also amplified.

The configuration cited in Japanese Unexamined Patent Application Publication No. H05-075862 has to separately have an adding unit to reduce the quantization error, which makes the configuration complex.

An aspect of the present invention is intended to provide an analog-to-digital convertor for an optical sensor capable of reducing a quantization error and simultaneously improving sensitivity in a simple configuration.

In order to solve the above problems, an analog-to-digital convertor of an integration type includes: a charging circuit having a capacitor configured to store electric charges based on an input current, a discharging circuit configured to discharge the electric charges stored in the capacitor; and a counting circuit configured to count a charge-discharge count of the capacitor in a first conversion period and in a second conversion period, in order to convert a current value of the input current into a digital value, wherein the first conversion period includes a first pre-charging period and a first counting period, the second conversion period includes a second pre-charging period and a second counting period, and the analog-to-digital convertor further comprises a phase changing circuit configured to change a first phase of an output signal of the charging circuit in the first counting period to a second phase in the second counting period.

In order to solve the above problems, another analog-to-digital convertor of an integration type includes: a charging circuit having a capacitor configured to store electric charges based on an input current; a discharging circuit configured to discharge the electric charges stored in the capacitor; and a counting circuit configured to count a charge-discharge count of the capacitor in a first conversion period and in a second conversion period, in order to convert a current value of the input current into a digital value, wherein the first conversion period includes a first pre-charging period and a first counting period, the second conversion period includes a second pre-charging period and a second counting period, the discharging circuit has a switch provided for discharging the electric charges stored in the capacitor, and the analog-to-digital convertor further comprises a random-pulse-width modulation circuit provided for generating a random-pulse-width modulation signal for changing an open-close time period of the switch in the first pre-charging period and in the second pre-charging period.

An aspect of the present invention can provide an analog-to-digital convertor for an optical sensor capable of reducing a quantization error and simultaneously improving sensitivity in a simple configuration.

DETAILED DESCRIPTION OF THE INVENTION

First Embodiment

Figure 1:
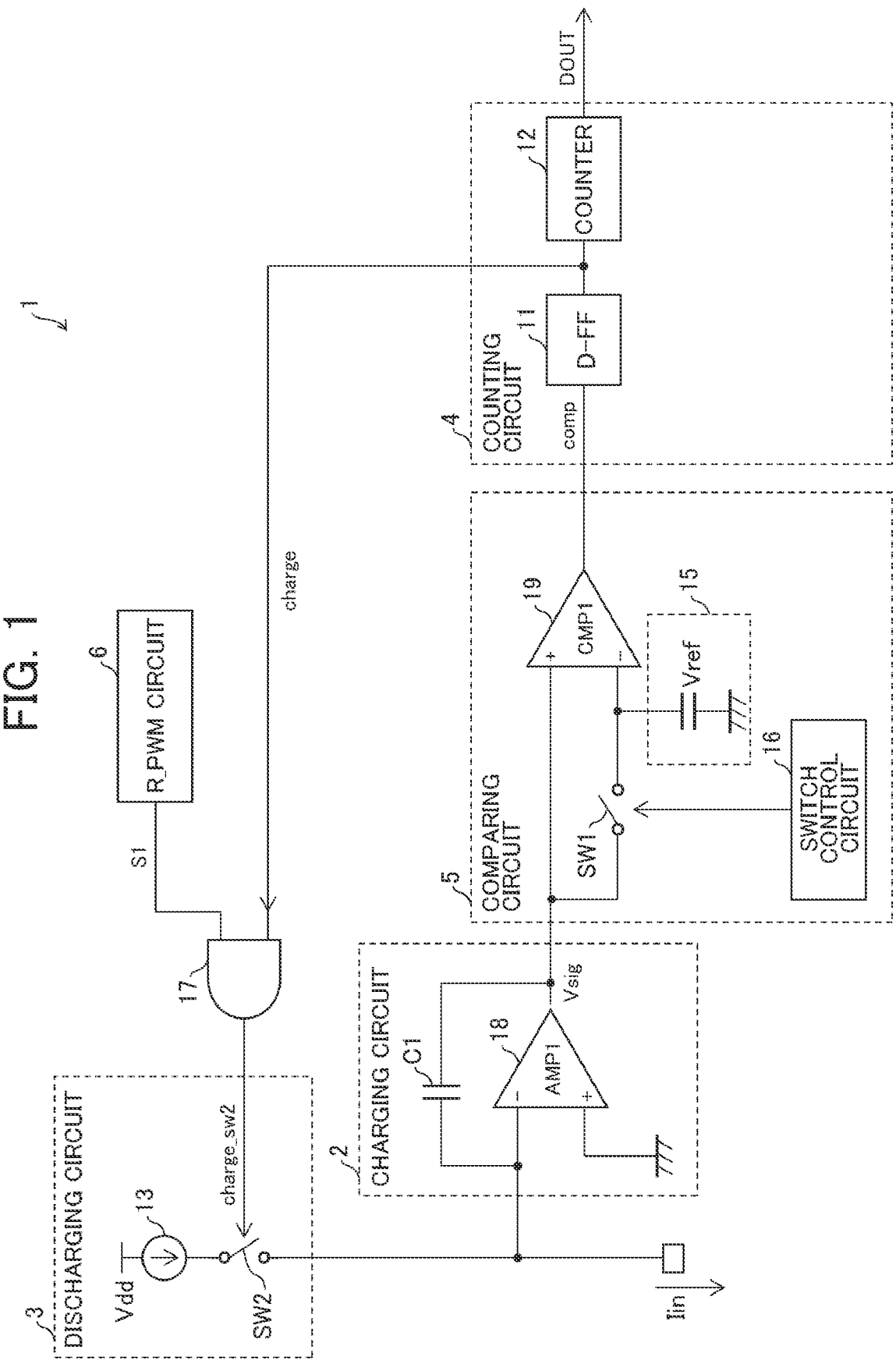
FIG. 1 is a circuit diagram illustrating an analog-to-digital convertor according to a first embodiment.

Described below in detail is an embodiment of the present invention. FIG. 1 is a circuit diagram illustrating an analog-to-digital convertor 1 according to the first embodiment.

The analog-to-digital convertor 1 is an integration analog-to-digital convertor, and includes: a charging circuit 2 having a capacitor C1 that stores electric charges based on an input current Iin; a discharging circuit 3 that discharges the electric charges stored in the capacitor C1; and a counting circuit 4 that counts a charge-discharge count of the capacitor C1 in a first conversion period and in a second conversion period, in order to convert a current value of the input current Iin into a digital value.

The first conversion period includes a first pre-charging period and a first counting period. The second conversion period includes a second pre-charging period and a second counting period.

The analog-to-digital convertor 1 further includes a random-pulse-width modulation circuit 6 (a phase changing circuit) that changes a first phase of an output signal Vsig of the charging circuit 2 in the first counting period to a second phase in the second counting period.

The random-pulse-width modulation circuit 6 randomly changes the first phase of the output signal Vsig to the second phase.

The counting circuit 4 arithmetically processes a count value in the first conversion period and a count value in the second conversion period, in order to convert a current value of the input current Iin into a digital value. The arithmetic processing includes mean processing, mean-square processing, and addition processing.

The discharging circuit 3 has a switch SW2 provided for discharging the electric charges stored in the capacitor C1. The random-pulse-width modulation circuit 6 is provided for generating a random-pulse-width modulation signal S1 for changing an open-close time period of the switch SW2 in the first pre-charging period and in the second pre-charging period.

The random-pulse-width modulation signal S1 randomly changes the open-close time period of the switch SW2.

The charging circuit 2 includes a differential amplifier 18. The analog-to-digital convertor 1 includes a comparing circuit 5. The comparing circuit 5 includes: a comparator 19; a voltage supply 15; and a switch control circuit 16.

The analog-to-digital convertor 1 according to the first embodiment executes pre-charging operation, similar to the analog-to-digital convertor 91 described as a conventional example. In the pre-charging operation, a pre-charging signal is applied to the switch SW2 in the pre-charging period, and the switch SW2 turns ON. Then, certain electric charges are discharged from the capacitor C1, and the output signal Vsig reduces. After that, in a counting period, the capacitor C1 is charged by the input current in to be measured, and, simultaneously, the discharge count of the discharging circuit 3 is counted by the count circuit 4.

Typically, an analog-to-digital convertor includes a quantization error. Described in brief below is a quantization error to be made in the analog-to-digital convertor 1 according to the first embodiment.

Figure 2:
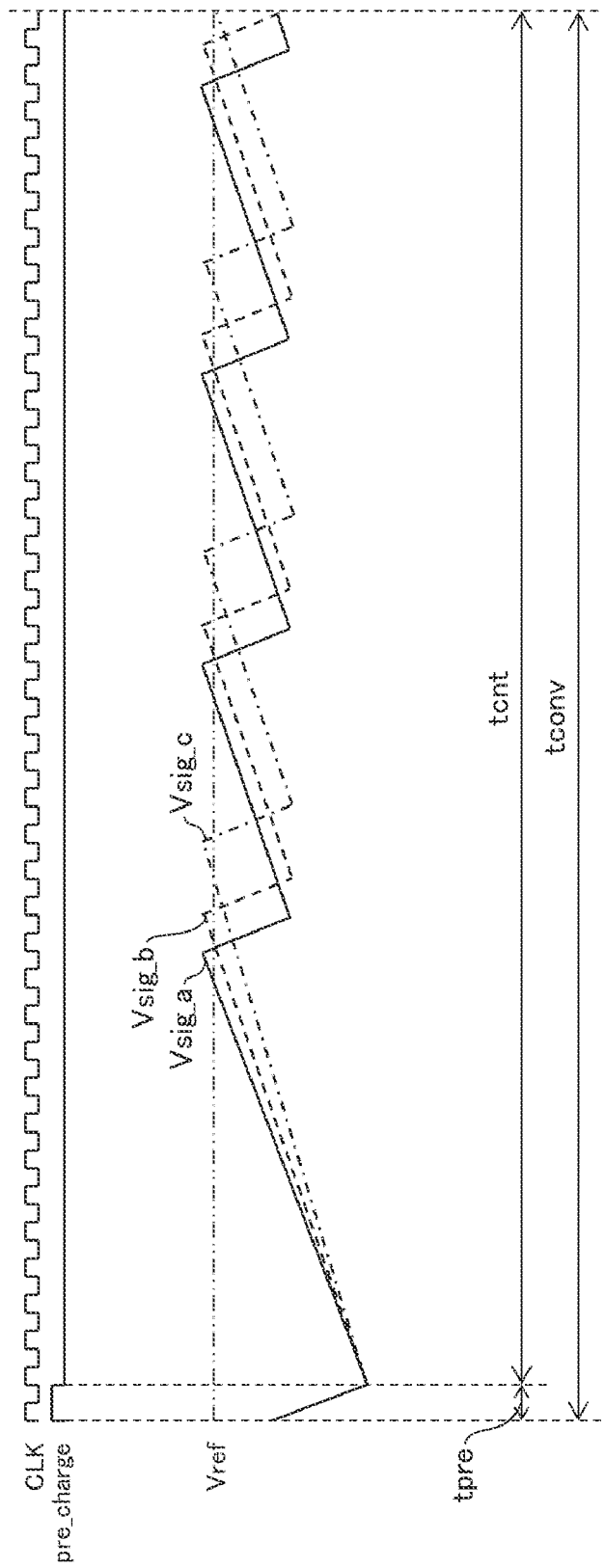
FIG. 2 is a waveform diagram illustrating output signals of a charging circuit according to a comparative example.

FIG. 2 is a waveform diagram illustrating output signals Vsig of a charging circuit according to a comparative example.

FIG. 2 shows waveforms of the output signals Vsig observed when the value of the input current Iin is changed. A waveform Vsig_a is a waveform observed when the input current Iin=Iin1 flows. In FIG. 2, the waveform Vsig_a is represented by a solid line.

The conversion period tconv includes a pre-charging period tpre and a counting period tent.

In the counting period tent, the waveform Vsig_a exceeds a reference voltage Vref four times. Hence, the count by the counting circuit 4 is four.

A waveform Vsig_c is a waveform observed when an input current Iin3 smaller than Iin1 flows. In FIG. 2, the waveform Vsig_c is represented by a dash-dot-dash line. In the counting period tent, the waveform Vsig_c exceeds the reference voltage Vref three times. Hence, the count is three.

Here, an input current Iin2 is smaller than Iin1 and larger than Iin3 (Iin1>Iin2>Iin3). A waveform Vsig_b of the input current Iin2 is represented by a dashed line. In the counting period tent, the waveform Vsig_b exceeds the reference voltage Vref four times. Hence, the count is four as seen in the case of Iin1.

As can be seen, there is a case where the count value does not decrease even though the input current Iin decreases. This is the quantization error of an analog-to-digital convertor.

In order to reduce the quantization error and improve the resolution, the analog-to-digital convertor 1 according to this embodiment includes the random-pulse-width modulation circuit 6 that randomly changes a pulse width of the pre-charging signal to be applied to the switch SW2 in the pre-charging period tpre (the first pre-charging period and the second pre-charging period).

Figure 3:
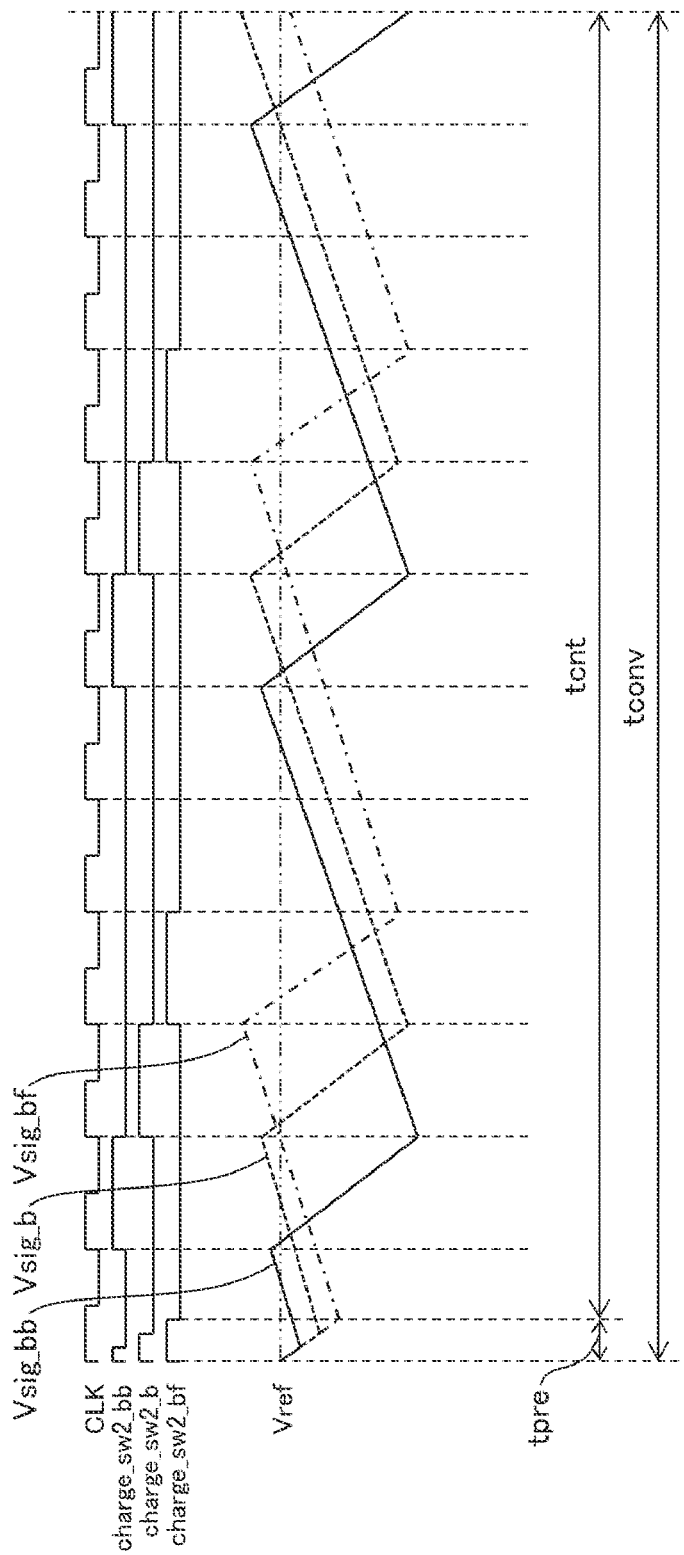
FIG. 3 is a waveform diagram illustrating output signals of a charging circuit provided to the analog-to-digital convertor.

FIG. 3 is a waveform diagram illustrating output signals Vsig of the charging circuit 2 provided to the analog-to-digital convertor 1. This FIG. 3 is equivalent to a timing diagram observed when a duty cycle of the random-pulse-width modulation signal S1 in the counting period tent is set to 100%.

FIG. 3 shows timing observed when pulse widths of pre-charging signals are changed. For the sake of brevity, three timings are illustrated.

FIG. 3 illustrates waveforms charge_sw2_bb and charge_sw2_bf observed when a pulse width of a waveform charge_sw2_b is changed. The waveform charge_sw2_b is of a pre-charging signal corresponding to the waveform Vsig_b illustrated in FIG. 2 and exhibiting a count of four. With respect to the waveform charge_sw2_b of the pre-charging signal of the waveform Vsig_b illustrated in FIG. 3, a pre-charging signal charge_sw2_bb is a signal having a short pulse width with early timing. A pre-charging signal charge_sw2_bf is a signal having a wide pulse width with late timing. A waveform Vsig_bb of the output signal Vsig with respect to the pre-charging signal charge_sw2_bb is represented by a solid line. A waveform Vsig_b of the output signal Vsig with respect to the pre-charging signal charge_sw2_b is represented by a dashed line. A waveform Vsig_bf of the output signal Vsig with respect to the pre-charging signal charge_sw2 is represented by a dash-dot-dash line.

With respect to the count of four for the waveform Vsig_b, the count for the waveform Vsig_bb remains four. In contrast, the count for the waveform Vsig_bf is three. The above waveforms show that the count value for the waveform Vsig_b is four, which is close to three.

Because one clock represents one count, the pulse width of the pre-charging signals charge_sw2_b, charge_sw2_bb, and charge_sw2_bf are controlled with one clock or less of a clock signal CLK so that a phase shift of one count or less can be generated.

As can be seen, the pulse width of a pre-charging signal to be applied to the switch SW2 in the pre-charging period tpre is changed to change the timing (to change the phase of the output signal Vsig), and the measurement operation is repeated in the counting period tent (the first counting period and the second counting period). For example, the timing of the pre-charging signal is changed and the measurement is conducted for 10 conversion periods tconv (the first conversion period and the second conversion period). If the count is three for all of the 10 conversion periods, the count value is 3. If the count is three for eight conversion periods out of 10 conversion periods, and four for two conversion periods, the count value can be 3.2. If the count is three for five conversion periods out of 10 conversion periods, and four for five conversion periods, the count value can be 3.5.

This is how the quantization error can be reduced to one-tenth and the resolution can be increased by 10 times.

The timing of the pre-charging signal is changed preferably at random. When the timing is changed at random, a tendency can be avoided of shifting the measurement result in a certain direction in accordance with a measurement count in the conversion period tconv and with a timing change status of the pre-charging signal. Hence, when the sampling timing of the pre-charging signal is changed at random, the quantization error can be reduced.

The analog-to-digital convertor 1 includes a selector 17. The selector 17 is a logical AND circuit (an AND circuit), and outputs a signal charge_sw2 for connecting the switch SW2 when the charge signal charge is 1 and the random-pulse-width modulation signal S1 is 1.

Figure 4:
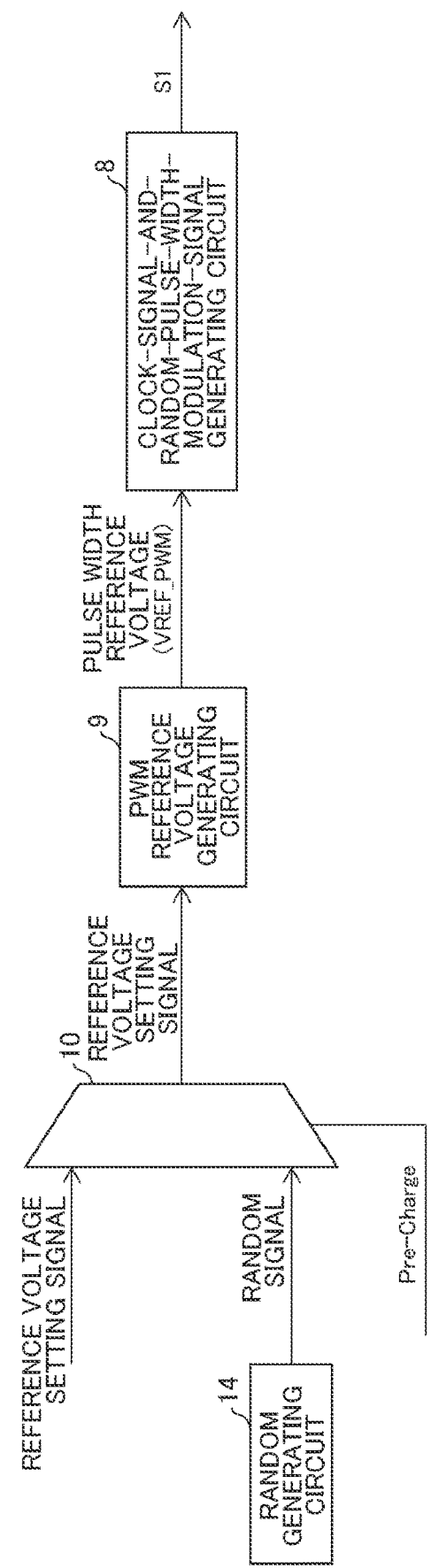
FIG. 4 is a circuit diagram illustrating a random-pulse-width modulation circuit provided to the analog-to-digital convertor.
Figure 5:
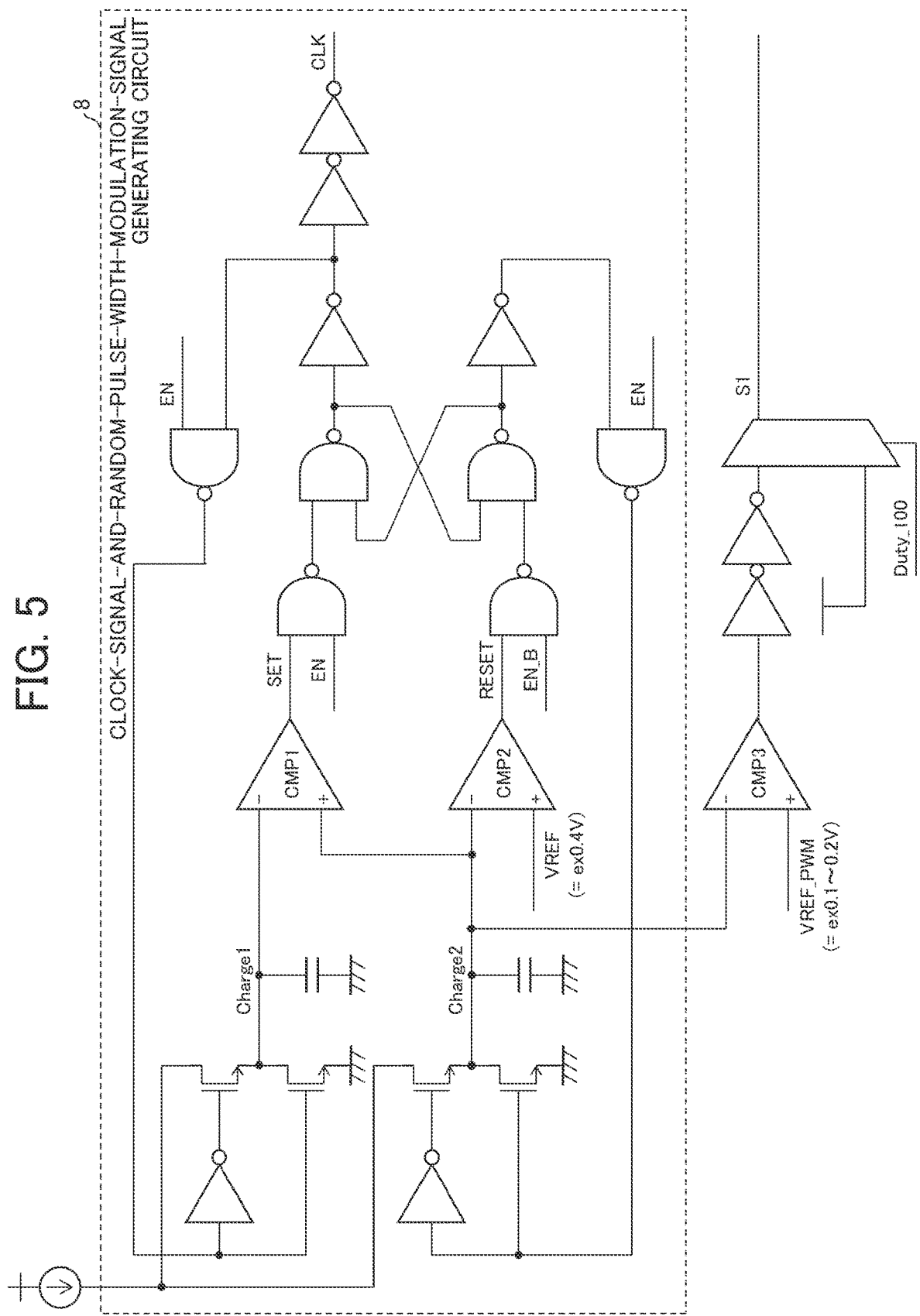
FIG. 5 is a circuit diagram illustrating a random-pulse-width modulation signal generating circuit provided to the random-pulse-width modulation circuit.
Figure 6:
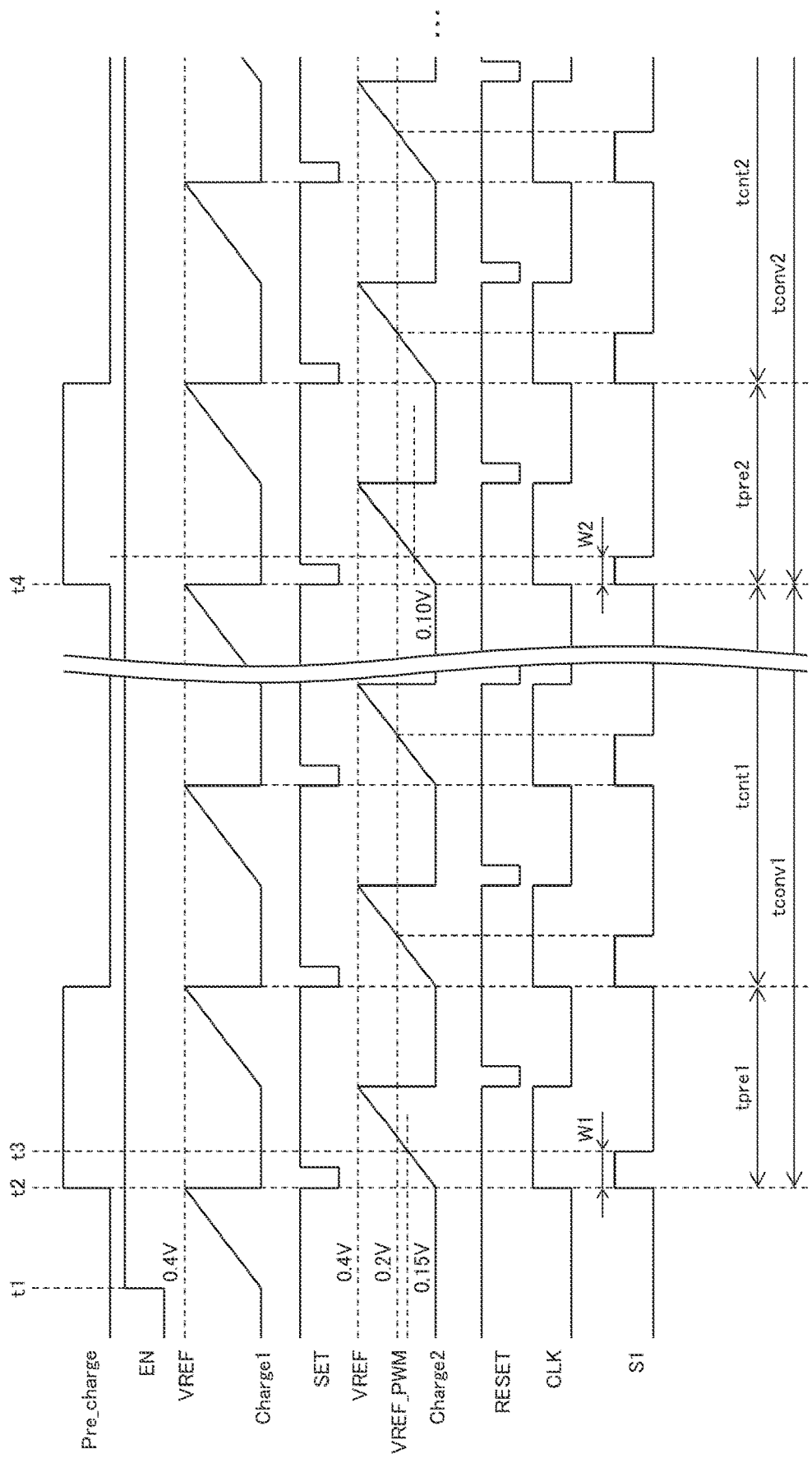
FIG. 6 is a waveform diagram illustrating operation timing of the random-pulse-width modulation signal generating circuit.
Figure 7:
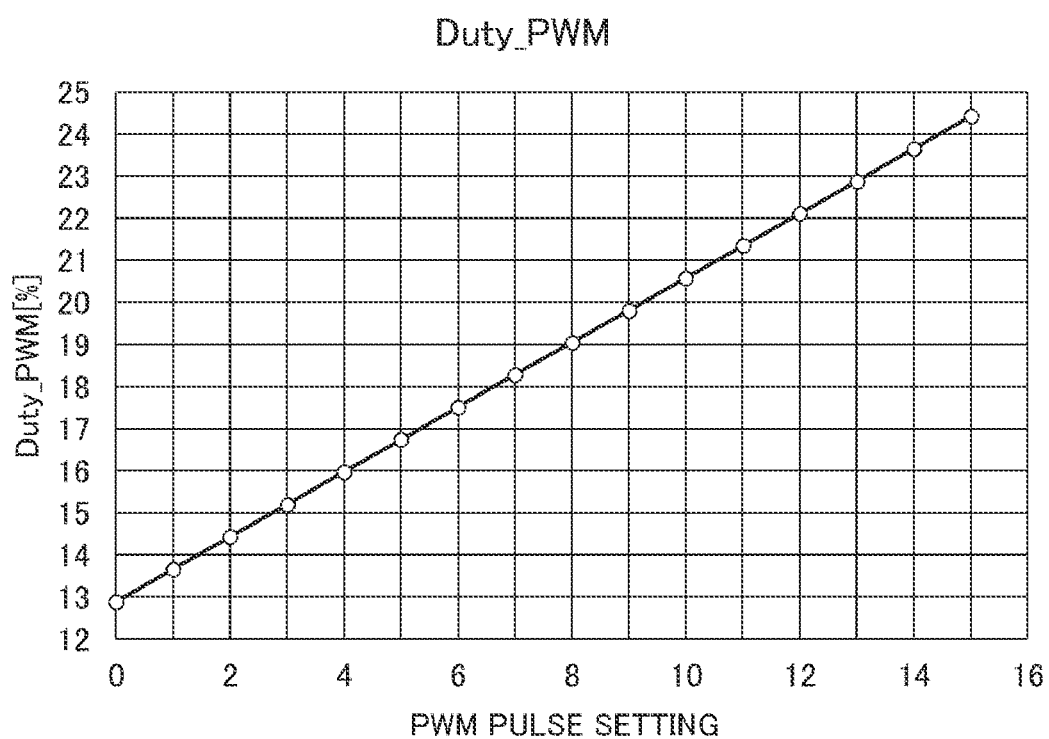
FIG. 7 is a graph illustrating a simulation result of the random-pulse-width modulation signal.

FIG. 4 is a circuit diagram illustrating the random-pulse-width modulation circuit 6 provided to the analog-to-digital convertor 1. FIG. 5 is a circuit diagram illustrating a clock-signal-and-random-pulse-width-modulation-signal generating circuit 8 provided to the random-pulse-width modulation circuit 6. FIG. 6 is a waveform diagram illustrating operation timing of the clock-signal-and-random-pulse-width-modulation-signal generating circuit 8. FIG. 7 is a graph illustrating a simulation result of the random-pulse-width modulation signal S1.

The random-pulse-width modulation circuit 6 includes: a random generating circuit 14 that generates a random signal; a selecting circuit 10 that selects one of a plurality of reference voltage setting signals in accordance with the random signal generated by the random generating circuit 14; a pulse width modulation (PWM) reference voltage generating circuit 9 that generates a pulse width reference voltage VREF_PWM in accordance with the reference voltage setting signal selected by the selecting circuit 10; and the clock-signal-and-random-pulse-width-modulation-signal generating circuit 8 that generates the clock signal CLK and the random-pulse-width modulation signal S1 in accordance with the pulse width reference voltage VREF_PWM generated by the reference voltage generating circuit 9. The random generating circuit 14, the selecting circuit 10, and the PWM reference voltage generating circuit 9 (a DA convertor) are typical circuits, and details of the circuits will not be elaborated upon here.

The random-pulse-width modulation circuit 6 in the above configuration operates as described below.

First, as illustrated in FIG. 6, a pre-charging signal Pre-Charge is input to the selecting circuit 10 at a time point t1, and the selecting circuit 10 randomly selects one of the reference voltage setting signals. Then, in accordance with the reference voltage setting signal selected by the selecting circuit 10, the reference voltage generating circuit 9 generates a pulse width reference voltage VREF_PWM, and supplies the pulse width reference voltage VREF_PWM to the clock-signal-and-random-pulse-width-modulation-signal generating circuit 8.

In the example of FIGS. 5 and 6, a 0.2-volt pulse width reference voltage VREF_PWM is supplied to the clock-signal-and-random-pulse-width-modulation-signal generating circuit 8.

Then, a signal EN goes HIGH at the time point t1. After that, an electric charge signal Charge1 and an electric charge signal Charge2 are repeatedly output. The electric charge signal Charge1 reaches a reference voltage VREF (here 0.4 V) of a comparator CMP1 at a time point t2. The electric charge signal Charge2 reaches the pulse width reference voltage VREF_PWM (here 0.2 V) selected above at a time point t3. The period between the time points t2 and t3 is a period in which the random-pulse-width modulation signal S1 is HIGH (a pulse width W1).

The clock-signal-and-random-pulse-width-modulation-signal generating circuit 8 outputs a clock signal CLK whose duty cycle is 50%. If the reference voltage VREF of a clock unit that outputs the clock signal CLK is 0.4 V, the duty cycle of the random-pulse-width modulation signal S1 is represented as Duty=VREF_PWM/VREF×50% when Duty_100=0. When Duty_100=1, Duty=100% holds (not dependent on the pulse width reference voltage VREF_PWM).

The cycle of the random-pulse-width modulation signal S1 is the same as the cycle of the clock signal CLK. The pulse width reference voltage VREF_PWM adjusts the pulse width (Duty) of the random-pulse-width modulation signal SL.

The random-pulse-width modulation signal S1 generated by the clock-signal-and-random-pulse-width-modulation-signal generating circuit 8 serves as a pre-charging signal to be applied to the switch SW2 in a pre-charging period tpre1. In a counting period tcnt1 succeeding the pre-charging period tpre1, the counting operation starts to count the charge-discharge count of the capacitor C1.

In the example illustrated in FIG. 6, the measurement is conducted for multiple times in the counting period tcint1 of a conversion period tconv1. After that, at a time point t4, the pre-charging signal Pre-Charge is input again to the selecting circuit 10, and the pulse width reference voltage VREF_PWM is changed (from, for example, 0.2 V to 0.10 V). The pulse width of the random-pulse-width modulation signal S1 is changed and reduced from a pulse width W1 to a pulse width W2.

In the example illustrated in FIG. 6, conversion periods are consecutively set twice; that is, the conversion period tconv1 and a conversion period tconv2. A result of the measurement in the conversion period tconv1 and a result of the measurement in the conversion period tconv2 are added together to improve sensitivity of the measurements.

Note that if the conversion period tconv1 and the conversion period tconv2 are under the same measurement condition, a quantization error occurs. Hence, the pulse width reference voltage VREF_PWM is changed at random in the pre-charging period tpre1 and in the pre-charging period tpre2, so that the pulse width of the random-pulse-width modulation signal S1 is changed at random. Hence, the quantization error is reduced.

In the conversion period tconv1 and the conversion period tconv2, only the pulse width of the random-pulse-width modulation signal S1 changes, and the operation has to be carried out under the same condition in the counting period tcnt1 and the counting period tcnt2.

FIG. 6 illustrates a case where the pulse width reference voltage VREF_PWM and the duty cycle of the random-pulse-width modulation signal S1 change as follows:
The pre-charging period tpre1: the pulse width reference voltage VREF_PWN=0.15 V→the duty cycle of the random-pulse-width modulation signal S1=18.75%;
The counting period tcnt1: the pulse width reference voltage VREF_PWN=0.40 V→the duty cycle of the random-pulse-width modulation signal S1=50%;
The pre-charging period tpre2: the pulse width reference voltage VREF_PWN=0.10 V→the duty cycle of the random-pulse-width modulation signal S1=12.5%; and
The counting period tcnt2: the pulse width reference voltage VREF_PWN=0.04 V→the duty cycle of the random-pulse-width modulation signal S1=50%.

FIGS. 5 and 6 show an example of a circuit for outputting the random-pulse-width modulation signal S1 whose pulse width has a duty cycle of 50% or less in the same cycle as that of a clock.

As can be seen, the pulse width of the random-pulse-width modulation signal S1 is changed, the measurement is conducted for multiple times, and the count values are subjected to mean processing. Such a feature can improve precision of the analog-to-digital convertor 1. Instead of the mean processing, square processing and addition processing may be executed.

Second Embodiment

Another embodiment of the present invention will be described below. Note that, for the sake of description, like reference signs designate members having identical functions between this embodiment and the above embodiment. Such members will not be elaborated upon here.

Figure 8:
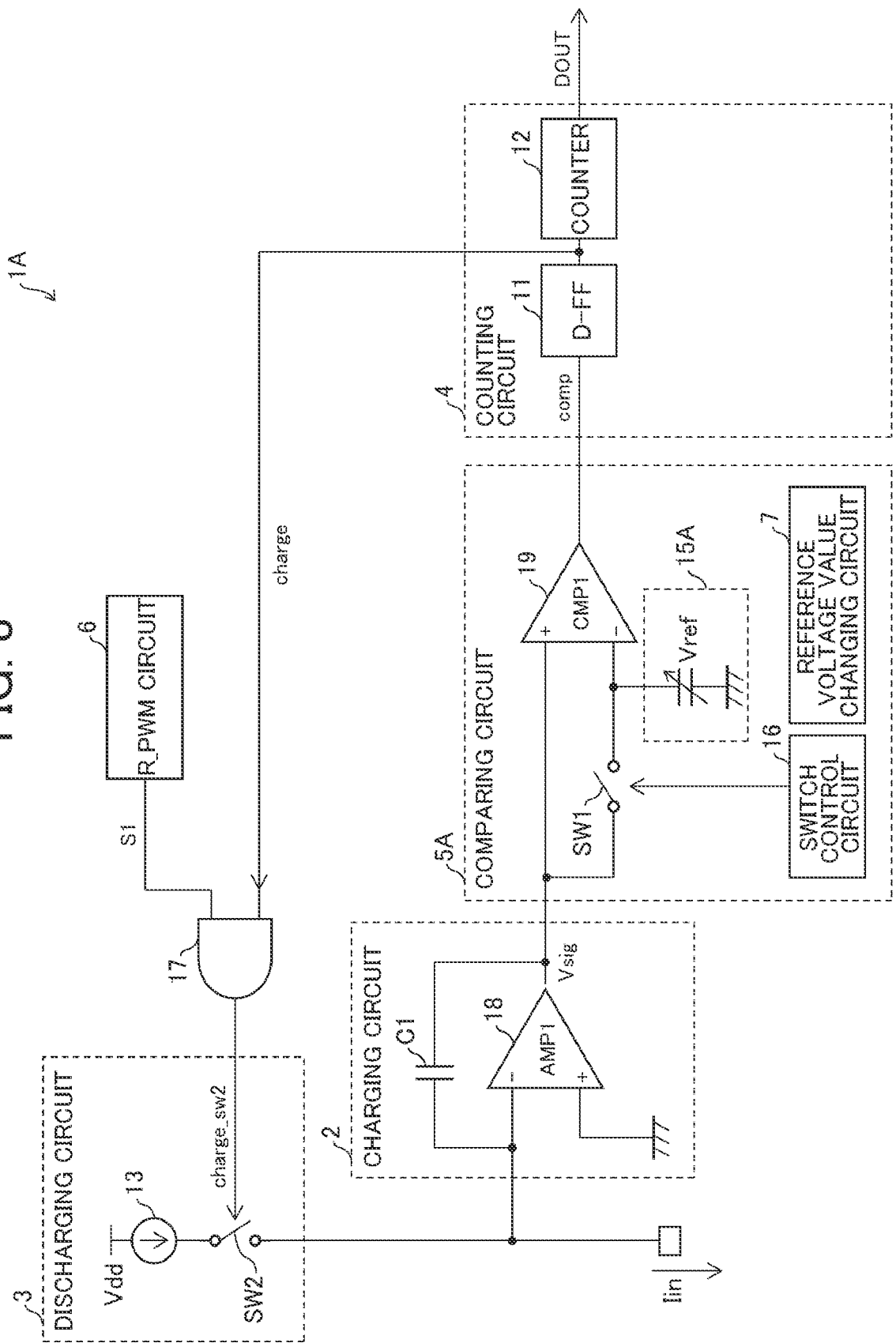
FIG. 8 is a circuit diagram illustrating an analog-to-digital convertor according to a second embodiment.
Figure 9:
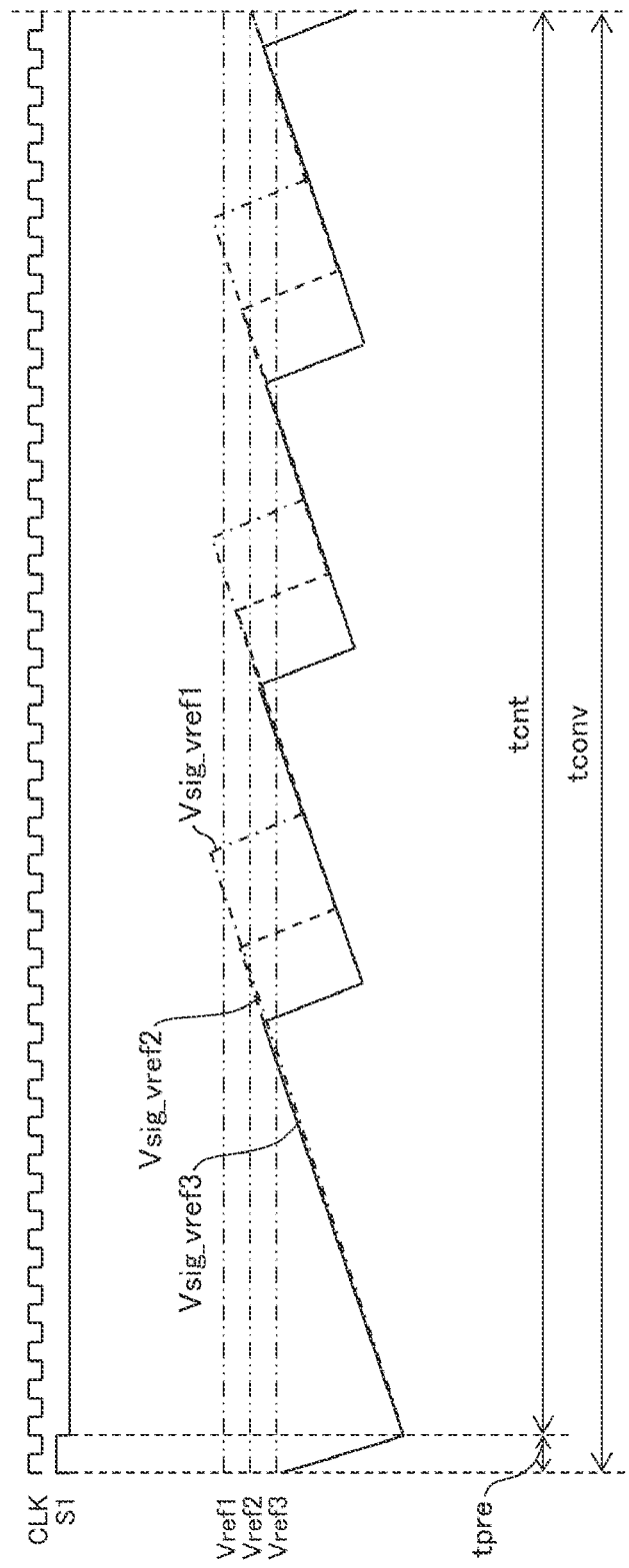
FIG. 9 is a waveform diagram illustrating output signals of a charging circuit provided to the analog-to-digital convertor.
Figure 10:
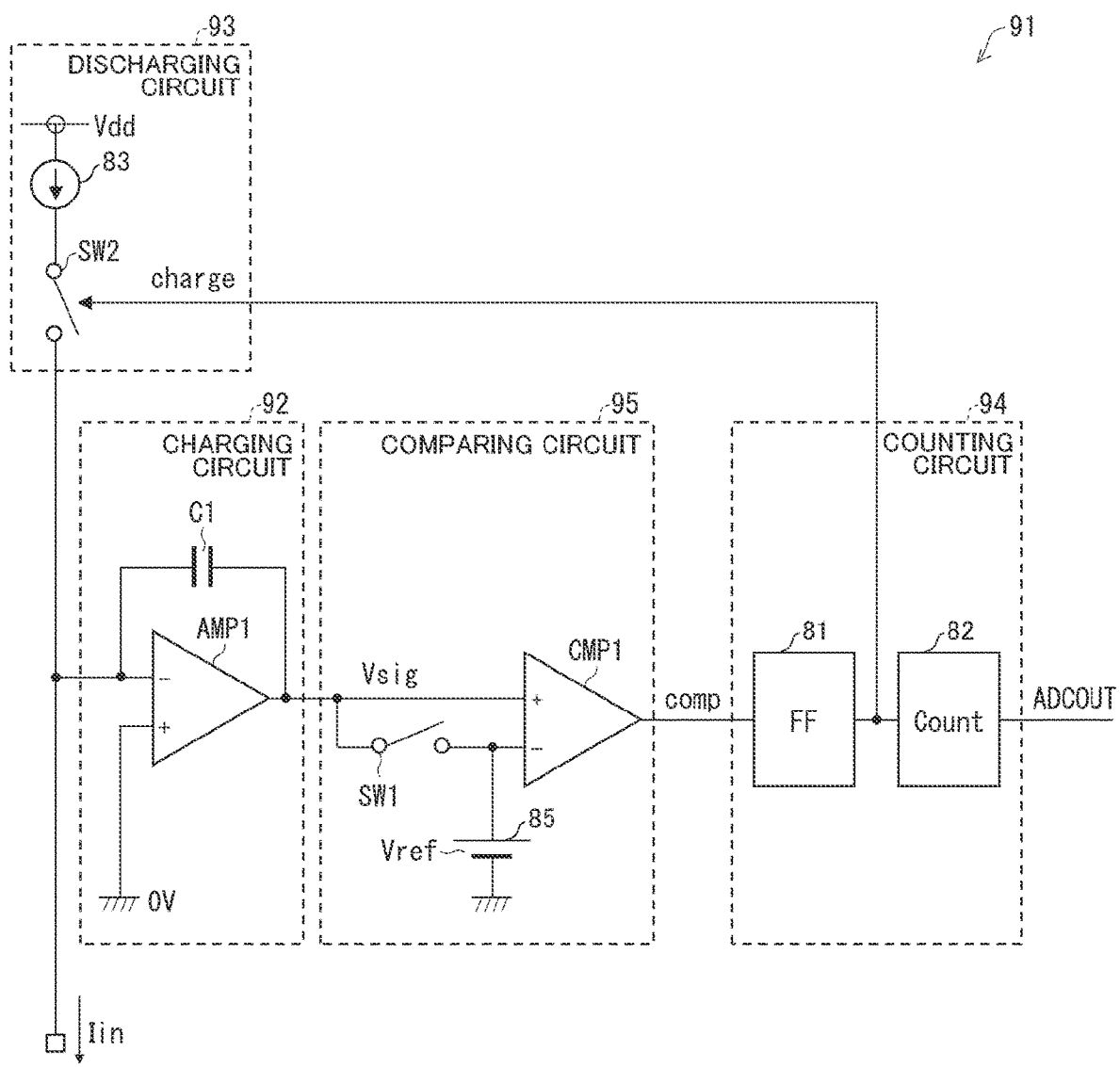
FIG. 10 is a circuit diagram illustrating a conventional analog-to-digital convertor.
Figure 11:
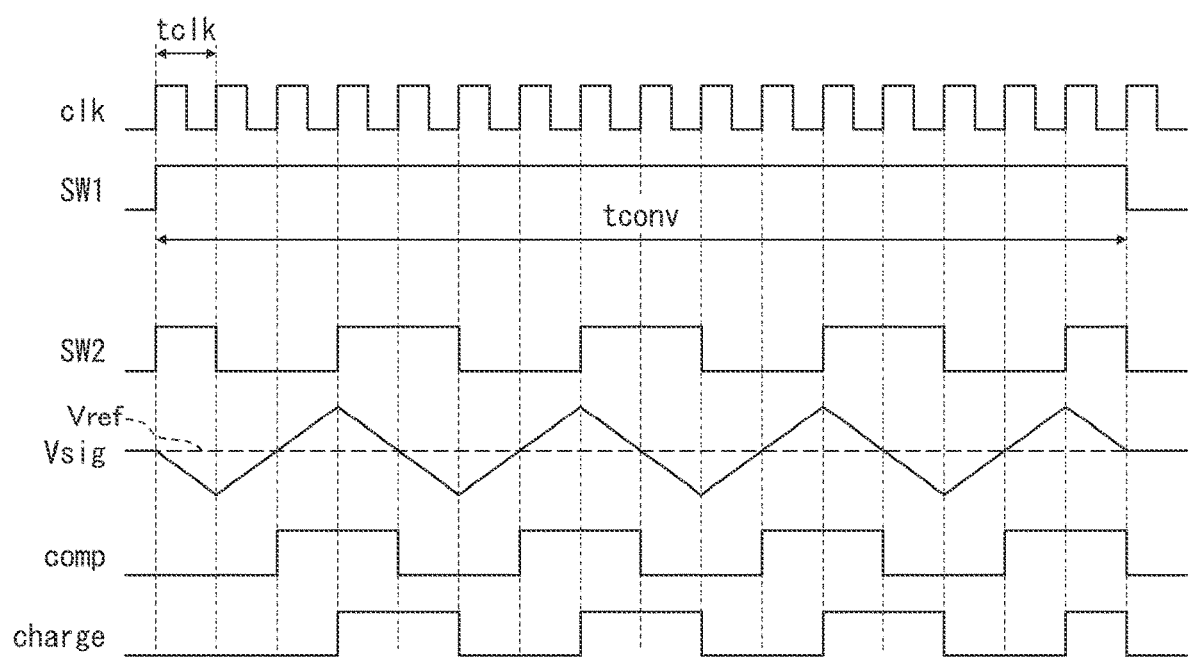
FIG. 11 is a waveform diagram illustrating operation timing of the conventional analog-to-digital convertor.

FIG. 8 is a circuit diagram illustrating an analog-to-digital convertor 1A according to a second embodiment. FIG. 9 is a waveform diagram illustrating output signals Vsig of the charging circuit 2 provided to the analog-to-digital convertor 1A. Like reference signs designate identical constituent features between the embodiments. Such constituent features will not be elaborated upon here.

In the first embodiment, the quantization error is reduced by changing the pulse width of the random-pulse-width modulation signal S1 to be applied to the switch SW2 in the pre-charging period tpre. What actually contributes to the reduction of the quantization error is that the cycle of the output signal Vsig is the same; whereas, the phase changes at random.

When attention is paid to this point, as illustrated in FIGS. 8 and 9, the same advantageous effects can be obtained when the reference voltage Vref is changed.

The analog-to-digital convertor 1A includes a comparing circuit 5A. The comparing circuit 5A includes: a voltage supply 15A including a variable power supply; and a reference voltage value changing circuit 7 that changes a value of a reference voltage to be supplied from the voltage supply 15A to the comparator 19.

A waveform Vsig_vref1 is a waveform observed when a value of a reference voltage Vref is a voltage value Vref1 (a first voltage value). A waveform Vsig_vref2 is a waveform observed when the value of the reference voltage Vref is a voltage value Vref2 (a second voltage value). A waveform Vsig_vref3 is a waveform observed when the value of the reference voltage Vref is a voltage value Vref3 (Vref3<Vref2<Vref1).

The pre-charging signal is the random-pulse-width modulation signal S1, and is in common among the waveforms Vsig_vref1, Vsig_vref2, and Vsig_vref3. Hence, a fall of the voltage by the discharging circuit 3 is the same among the three waveforms. A rise of the voltage is caused by a common current Iin, and the rising angle is also the same among the three waveforms.

The waveform Vsig_vref3 (a solid line) exceeds the voltage value Vref3, and after that, falls. The waveform Vsig_vref2 (a dashed line) exceeds the voltage value Vref2, and after that, falls. The waveform Vsig_vref1 (a dash-dot-dash line) exceeds the voltage value Vref1, and after that, falls.

The voltage falls in a counting period tcnt in which a signal charge_sw2 based on an electric charge signal charge is applied to the switch SW2. Because the time period is common among the three waveforms, the falling voltage is the same. The discharged electric charges are also common among the three waveforms, the time period taken for a repeating charge is also the same.

As can be seen, once the waveforms Vsig_vref1, Vsig_vref2, and Vsig_vref3 exceed the reference voltages Vref, the charge-discharge period is the same. Hence, the waveforms Vsig_vref1, Vsig_vref2, and Vsig_vref3 represent the same cycle.

As can be seen, the analog-to-digital convertor 1A further includes the comparing circuit 5A that compares an output signal Vsig of the charging circuit 2 and a reference voltage Vref. The reference voltage value changing circuit 7 (a phase changing circuit) of the comparing circuit 5A changes the voltage value Vref1 (the first voltage value) of the reference voltage Vref in a counting period tcnt (the first counting period) to the voltage value Vref2 (the second voltage value) in another counting period tcnt (the second counting period).

Summary

The analog-to-digital convertors 1 and 1A of an integration type according to a first aspect of the present invention include: the charging circuit 2 having the capacitor C1 that stores electric charges based on the input current Iin; the discharging circuit 3 that discharges the electric charges stored in the capacitor C1; and the counting circuit 4 that counts a charge-discharge count of the capacitor C1 in a first conversion period and in a second conversion period (the conversion periods tconv), in order to convert a current value of the input current Iin into a digital value. The first conversion period (a conversion period tconv) includes a first pre-charging period (a pre-charging period tpre) and a first counting period (a counting period tcnt). The second conversion period (a conversion period tconv) includes a second pre-charging period (a pre-charging period tpre) and a second counting period (a counting period tcnt). The analog-to-digital convertors 1 and 1A further include a phase changing circuit (the random-pulse-width modulation circuit 6 and the reference voltage value changing circuit 7) that changes a first phase of an output signal Vsig of the charging circuit 2 in the first counting period (the counting period tcnt) to a second phase in the second counting period (the counting period tcnt).

In the above configuration, the first phase of the output signal of the charging circuit in the first count period is changed to the second phase in the second count period. Hence, the phase of the output signal of the charging circuit changes in accordance with a count period. Such a feature can reduce a quantization error of, and simultaneously improve sensitivity of, the analog-to-digital convertor.

In the analog-to-digital convertors 1 and 1A, of a second aspect of the present invention, according to the first aspect, the phase changing circuit (the random-pulse-width modulation circuit 6 and the reference voltage value changing circuit 7) preferably randomly changes the first phase to the second phase.

In the above configuration, the phases are changed at random. Such a feature makes it possible to avoid a tendency of shifting the measurement result in a certain direction in accordance with a measurement count in the conversion period and with a timing change status of the pre-charging signal.

In the analog-to-digital convertors 1 and 1A, of a third aspect of the present invention, according to the second aspect, the counting circuit 4 preferably arithmetically processes a count value in the first conversion period (the conversion period tconv) and a count value in the second conversion period (the conversion period tconv), in order to convert the current value of the input current Iin into the digital value.

In the above configuration, multiple count values are arithmetically processed. Such a feature can improve precision of the analog-to-digital conversion.

The analog-to-digital convertor 1A, of a fourth aspect of the present invention, according to any one of the first to third aspects preferably further includes the comparing circuit 5 that compares the output signal Vsig of the charging circuit 2 and a reference voltage Vref. The phase changing circuit preferably includes the reference voltage value changing circuit 7 that changes a first voltage value (the voltage value Vref1) of the reference voltage Vref in the first counting period (tcnt) to a second voltage value Vref2 in the second counting period (tcnt).

In the above configuration, a voltage value can be changed of the reference voltage to be compared with the output signal of the charging circuit. Such a feature can change the phase of the output signal of the charging circuit.

The analog-to-digital convertor 1 of an integration type according to a fifth aspect of the present invention includes: a charging circuit 2 having a capacitor C1 that stores electric charges based on the input current Iin; a discharging circuit 3 that discharges the electric charges stored in the capacitor C1; and a counting circuit 4 that counts a charge-discharge count of the capacitor C1 in a first conversion period (a conversion period tconv) and in a second conversion period (a conversion period tconv), in order to convert a current value of the input current Iin into a digital value. The first conversion period (the conversion period tconv) includes a first pre-charging period (a pre-charging period tpre) and a first counting period (a counting period tcnt). The second conversion period (the conversion period tconv) includes a second pre-charging period (a pre-charging period tpre) and a second counting period (a counting period tcnt). The discharging circuit 3 has the switch SW2 provided for discharging the electric charges stored in the capacitor C1. The analog-to-digital convertor 1 further includes a random-pulse-width modulation circuit 6 provided for generating a random-pulse-width modulation signal S1 for changing an open-close time period of the switch SW2 in the first pre-charging period and in the second pre-charging period (the pre-charging periods tpre).

In the above configuration, an open-close time period of the switch is changed in the first and second pre-charging periods. Thus, the first phase of the output signal of the charging circuit in the first count period is changed to the second phase in the second count period. Hence, the phase of the output signal of the charging circuit changes in accordance with a count period. Such a feature can reduce a quantization error of, and simultaneously improve sensitivity of, the analog-to-digital convertor.

In the analog-to-digital convertor 1, of a sixth aspect of the present invention, according to the fifth aspect, the random-pulse-width modulation signal S1 preferably randomly changes the open-close time period of the switch SW2.

In the above configuration, the phases are changed at random. Such a feature makes it possible to avoid a tendency of shifting the measurement result in a certain direction in accordance with a measurement count in the conversion period and with a timing change status of the pre-charging signal.

In the analog-to-digital convertor 1, of a seventh aspect of the present invention, according to the sixth aspect, the counting circuit 4 preferably arithmetically processes a count value in the first conversion period (the conversion period tconv) and a count value in the second conversion period (the conversion period tconv), in order to convert the current value of the input current Iin into the digital value.

In the above configuration, multiple count values are arithmetically processed. Such a feature can improve precision of the analog-to-digital conversion.

In the analog-to-digital convertor 1, of an eighth aspect of the present invention, according to claim 5, the random-pulse-width modulation circuit 6 preferably includes: the selecting circuit 10 that selects one of reference voltage setting signals in accordance with a random signal; the reference voltage generating circuit 9 that generates a reference voltage in accordance with the one reference voltage setting signal selected by the selecting circuit 10; and the random-pulse-width-modulation-signal generating circuit (the clock-signal-and-random-pulse-width-modulation-signal generating circuit 8) that generates the random-pulse-width modulation signal S1 in accordance with the reference voltage generated by the reference voltage generating circuit 9.

The above configuration makes it possible to generate a random-pulse-width modulation signal that randomly changes the open-close time period of the switch in accordance with the random signal.

In the analog-to-digital convertor 1, of a ninth aspect of the present invention, according to the eighth aspect, the random-pulse-width-modulation-signal generating circuit (the clock-signal-and-random-pulse-width-modulation-signal generating circuit 8) generates the random-pulse-width modulation signal S1 having a pulse width based on a voltage value of the reference voltage.

The above configuration makes it possible to change the open-close time period of the switch of the discharging circuit in the first and second pre-charging periods, using the random-pulse-width modulation signal having a pulse width based on the voltage value of the reference voltage.

The present invention shall not be limited to the embodiments described above, and can be modified in various manners within the scope of claims. The technical aspects disclosed in different embodiments are to be appropriately combined together to implement another embodiment. Such an embodiment shall be included within the technical scope of the present invention. Moreover, the technical aspects disclosed in each embodiment may be combined to achieve a new technical feature. While there have been described what are at present considered to be certain embodiments of the invention, it will be understood that various modifications may be made thereto, and it is intended that the appended claim cover all such modifications as fall within the true spirit and scope of the invention.

What is claimed is:

1. An analog-to-digital convertor of an integration type, comprising:
   a charging circuit having a capacitor configured to store electric charges based on an input current;
   a discharging circuit configured to discharge the electric charges stored in the capacitor; and
   a counting circuit configured to count a charge-discharge count of the capacitor in a first conversion period and in a second conversion period, in order to convert a current value of the input current into a digital value,
   wherein the first conversion period includes a first pre-charging period and a first counting period,
   the second conversion period includes a second pre-charging period and a second counting period, and the analog-to-digital convertor further comprises a phase changing circuit configured to change a first phase of an output signal of the charging circuit in the first counting period to a second phase in the second counting period.

2. The analog-to-digital convertor according to claim 1, wherein the phase changing circuit randomly changes the first phase to the second phase.

3. The analog-to-digital convertor according to claim 2, wherein the counting circuit arithmetically processes a count value in the first conversion period and a count value in the second conversion period, in order to convert the current value of the input current into the digital value.

4. The analog-to-digital convertor according to claim 1, further comprising
a comparing circuit configured to compare the output signal of the charging circuit and a reference voltage,
wherein the phase changing circuit includes a reference voltage value changing circuit configured to change a first voltage value of the reference voltage in the first counting period to a second voltage value in the second counting period.

5. An analog-to-digital convertor of an integration type, comprising:
a charging circuit having a capacitor configured to store electric charges based on an input current;
a discharging circuit configured to discharge the electric charges stored in the capacitor; and
a counting circuit configured to count a charge-discharge count of the capacitor in a first conversion period and in a second conversion period, in order to convert a current value of the input current into a digital value,
wherein the first conversion period includes a first pre-charging period and a first counting period,
the second conversion period includes a second pre-charging period and a second counting period,
the discharging circuit has a switch provided for discharging the electric charges stored in the capacitor, and
the analog-to-digital convertor further comprises a random-pulse-width modulation circuit provided for generating a random-pulse-width modulation signal for changing an open-close time period of the switch in the first pre-charging period and in the second pre-charging period.

6. The analog-to-digital convertor according to claim 5, wherein the random-pulse-width modulation signal randomly changes the open-close time period of the switch.

7. The analog-to-digital convertor according to claim 6, wherein the counting circuit arithmetically processes a count value in the first conversion period and a count value in the second conversion period, in order to convert the current value of the input current into the digital value.

8. The analog-to-digital convertor according to claim 5, wherein the random-pulse-width modulation circuit includes:
a selecting circuit configured to select one of reference voltage setting signals in accordance with a random signal;
a reference voltage generating circuit configured to generate a reference voltage in accordance with the one reference voltage setting signal selected by the selecting circuit; and
a random-pulse-width-modulation-signal generating circuit configured to generate the random-pulse-width modulation signal in accordance with the reference voltage generated by the reference voltage generating circuit.

9. The analog-to-digital convertor according to claim 8, wherein the random-pulse-width-modulation-signal generating circuit generates the random-pulse-width modulation signal having a pulse width based on a voltage value of the reference voltage.

\* \* \* \* \*